(12) United States Patent
Ninomiya et al.

(10) Patent No.: US 9,142,773 B2
(45) Date of Patent: Sep. 22, 2015

(54) VARIABLE RESISTANCE NONVOLATILE MEMORY ELEMENT AND METHOD OF MANUFACTURING THE SAME

(71) Applicant: Panasonic Corporation, Osaka (JP)

(72) Inventors: Takeki Ninomiya, Osaka (JP); Takeshi Takagi, Kyoto (JP); Koji Katayama, Nara (JP); Yoshio Kawashima, Osaka (JP)

(73) Assignee: Panasonic Intellectual Property Management Co., Ltd, Osaka (JP)

( * ) Notice: Subject to any disclaimer, the term of this patent is extended or adjusted under 35 U.S.C. 154(b) by 5 days.

(21) Appl. No.: 14/006,698

(22) PCT Filed: Jan. 18, 2013

(86) PCT No.: PCT/JP2013/000216
§ 371 (c)(1),
(2) Date: Sep. 23, 2013

(87) PCT Pub. No.: WO2013/111545
PCT Pub. Date: Aug. 1, 2013

(65) Prior Publication Data
US 2014/0203234 A1    Jul. 24, 2014

(30) Foreign Application Priority Data
Jan. 25, 2012 (JP) ................................. 2012-013401

(51) Int. Cl.
*H01L 45/00* (2006.01)
(52) U.S. Cl.
CPC ............. *H01L 45/145* (2013.01); *H01L 45/08* (2013.01); *H01L 45/1233* (2013.01); *H01L 45/146* (2013.01); *H01L 45/1608* (2013.01); *H01L 45/1675* (2013.01)

(58) Field of Classification Search
CPC .................................................... H01L 45/145
USPC ........................................................ 257/2, 4
See application file for complete search history.

(56) References Cited

U.S. PATENT DOCUMENTS 8,022,502 B2   9/2011   Kanzawa et al.
8,115,586 B2   2/2012   Hosoi et al.
(Continued)

FOREIGN PATENT DOCUMENTS

JP   2007-180473   7/2007
JP   2009-130138   6/2009
(Continued)

OTHER PUBLICATIONS
Lee et al. "Ta2O5-x/TaO2-x bilayer structures," nature material vol. 10 p. 625-630, Aug. 2011.*
(Continued)

*Primary Examiner* — Matthew Reames
(74) *Attorney, Agent, or Firm* — Wenderoth, Lind & Ponack, L.L.P.

(57) ABSTRACT

A variable resistance nonvolatile memory element includes: first and second electrode layers; a first variable resistance layer between the first and second electrode layers; and a second variable resistance layer between the second electrode layer and the first variable resistance layer and having a higher resistance value than the first variable resistance layer. When viewed in a direction perpendicular to the major surface of the second variable resistance layer, an outline of the second variable resistance layer is located inwardly of the outline of any one of the second electrode layer and the first variable resistance layer, and an outline of a face of the second variable resistance layer, the face being in contact with the first variable resistance layer is located inwardly of an outline of a face of the first variable resistance layer, the face being in contact with the second variable resistance layer.

9 Claims, 9 Drawing Sheets

(56) References Cited

U.S. PATENT DOCUMENTS

| | | |
|---|---|---|
| 8,179,713 B2 | 5/2012 | Kanzawa et al. |
| 8,345,465 B2 | 1/2013 | Muraoka et al. |
| 8,394,669 B2 | 3/2013 | Arita et al. |
| 8,437,173 B2 | 5/2013 | Hayakawa et al. |
| 8,445,319 B2 | 5/2013 | Kanzawa et al. |
| 8,471,235 B2 | 6/2013 | Kawashima et al. |
| 2009/0096568 A1 | 4/2009 | Hosoi et al. |
| 2009/0134431 A1 | 5/2009 | Tabata et al. |
| 2009/0200640 A1 | 8/2009 | Hosoi et al. |
| 2009/0221146 A1 | 9/2009 | Seko et al. |
| 2009/0283736 A1 | 11/2009 | Kanzawa et al. |
| 2010/0259966 A1 | 10/2010 | Kanzawa et al. |
| 2010/0271860 A1 | 10/2010 | Muraoka et al. |
| 2010/0314602 A1 | 12/2010 | Takano et al. |
| 2011/0220862 A1 | 9/2011 | Arita et al. |
| 2011/0233511 A1 | 9/2011 | Kawashima et al. |
| 2011/0294259 A1 | 12/2011 | Kanzawa et al. |
| 2012/0063201 A1 | 3/2012 | Hayakawa et al. |
| 2012/0252184 A1 | 10/2012 | Ninomiya et al. |
| 2012/0280199 A1 | 11/2012 | Takagi |
| 2013/0037777 A1 | 2/2013 | Mikawa et al. |

FOREIGN PATENT DOCUMENTS

| | | |
|---|---|---|
| JP | 2009-206418 | 9/2009 |
| JP | 2010-287683 | 12/2010 |
| WO | 2008/149484 | 12/2008 |
| WO | 2009/147790 | 12/2009 |
| WO | 2010/038442 | 4/2010 |
| WO | 2010/064444 | 6/2010 |
| WO | 2011/007538 | 1/2011 |
| WO | 2011/064967 | 6/2011 |
| WO | 2011/074243 | 6/2011 |
| WO | 2011/114725 | 9/2011 |
| WO | 2011/132423 | 10/2011 |

OTHER PUBLICATIONS

International Search Report issued Mar. 5, 2013 in International (PCT) Application No. PCT/JP2013/000216.

* cited by examiner

FIG. 1 - PRIOR ART
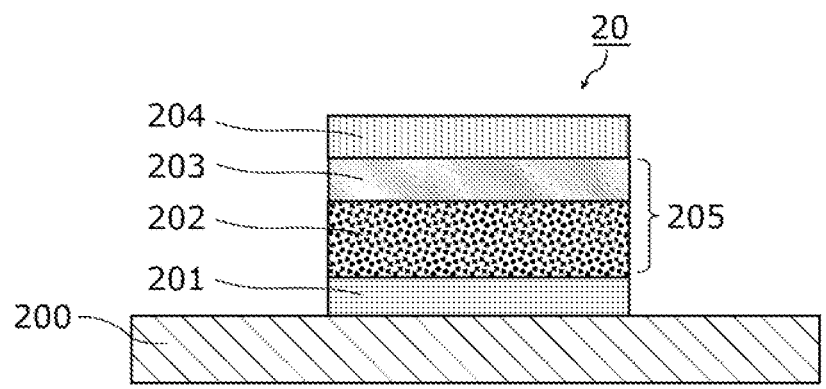
FIG. 2
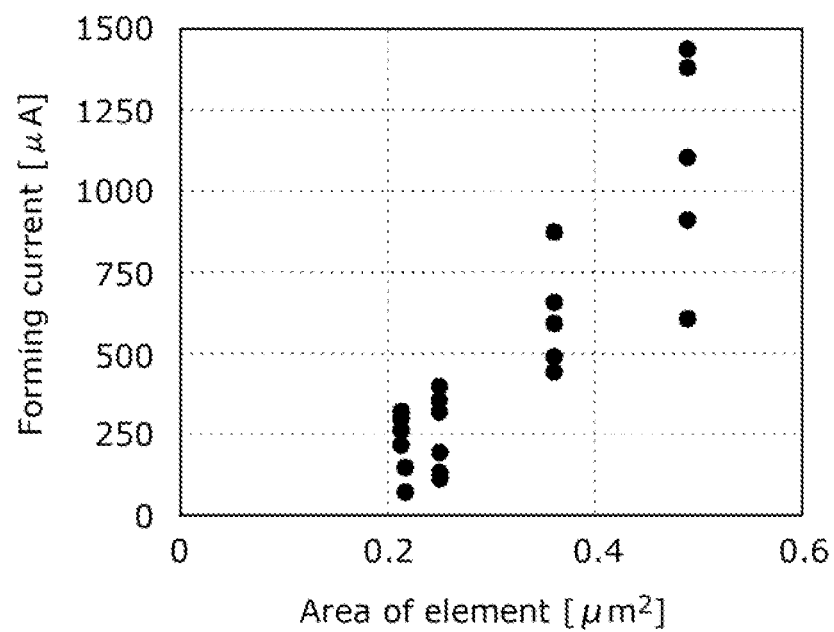

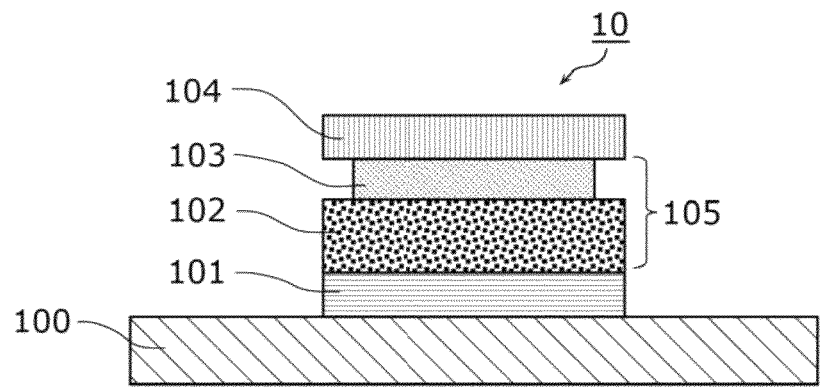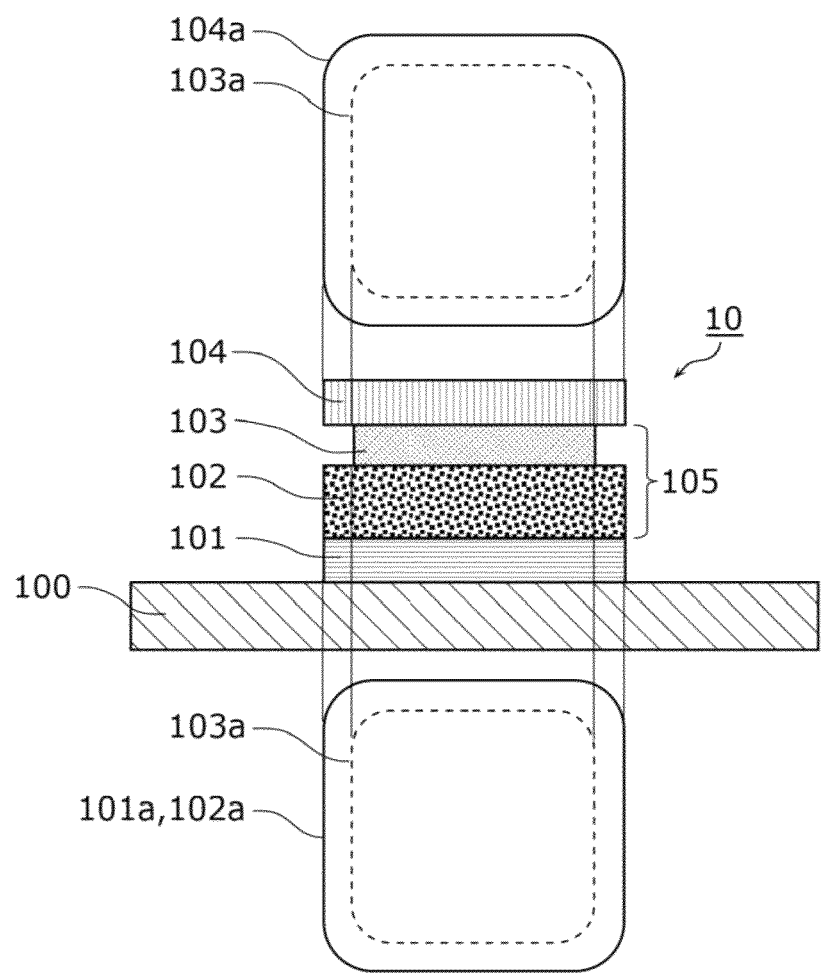

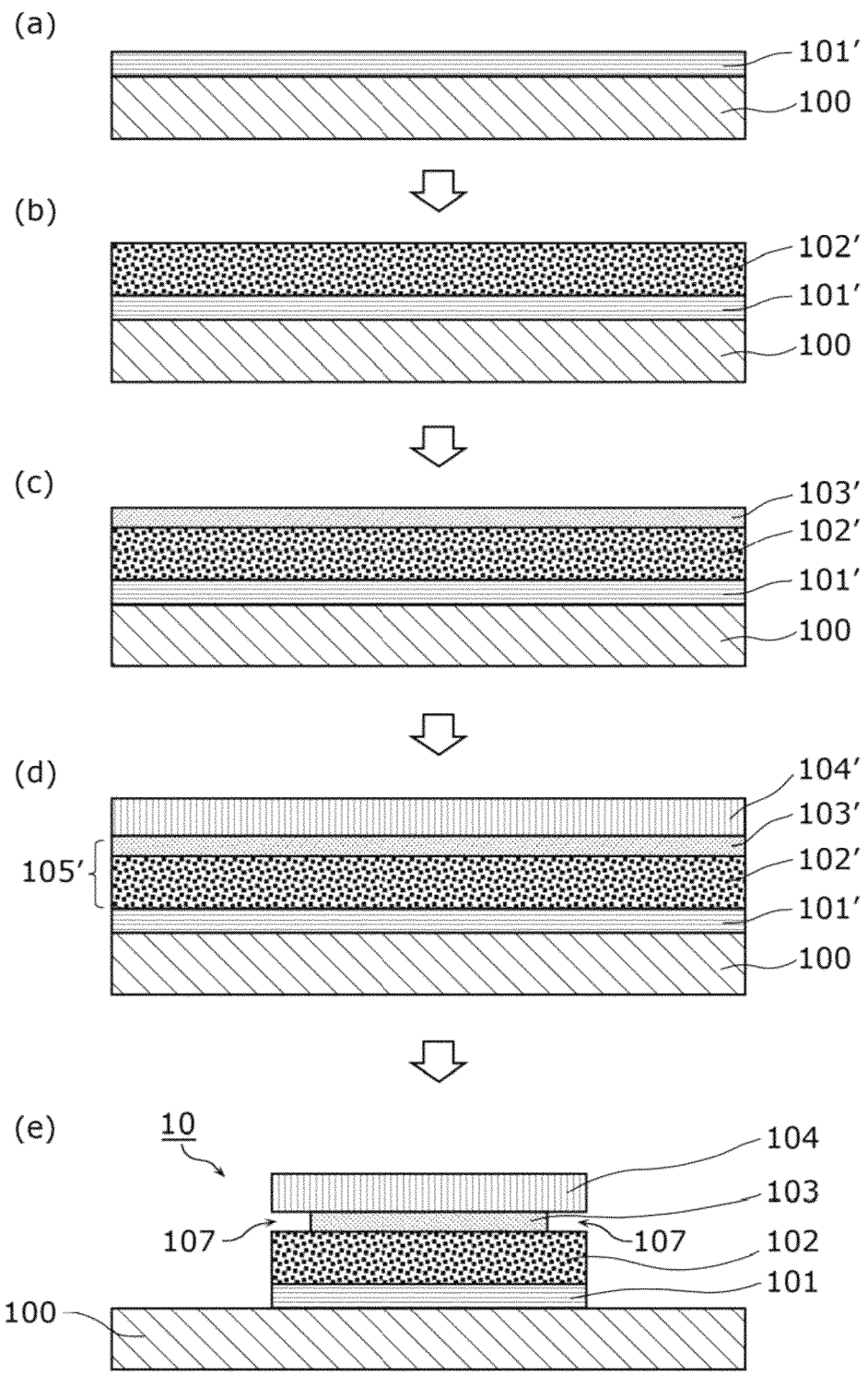

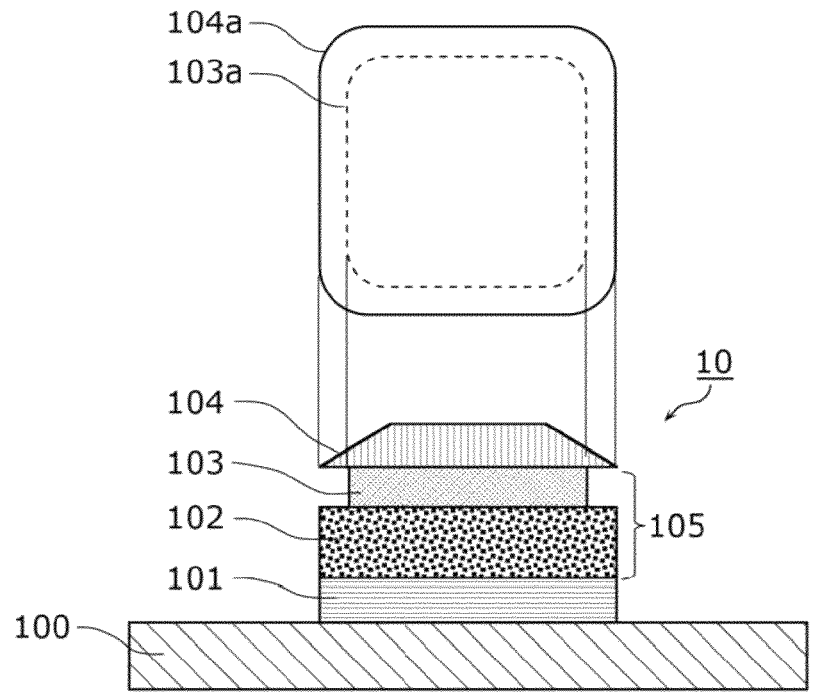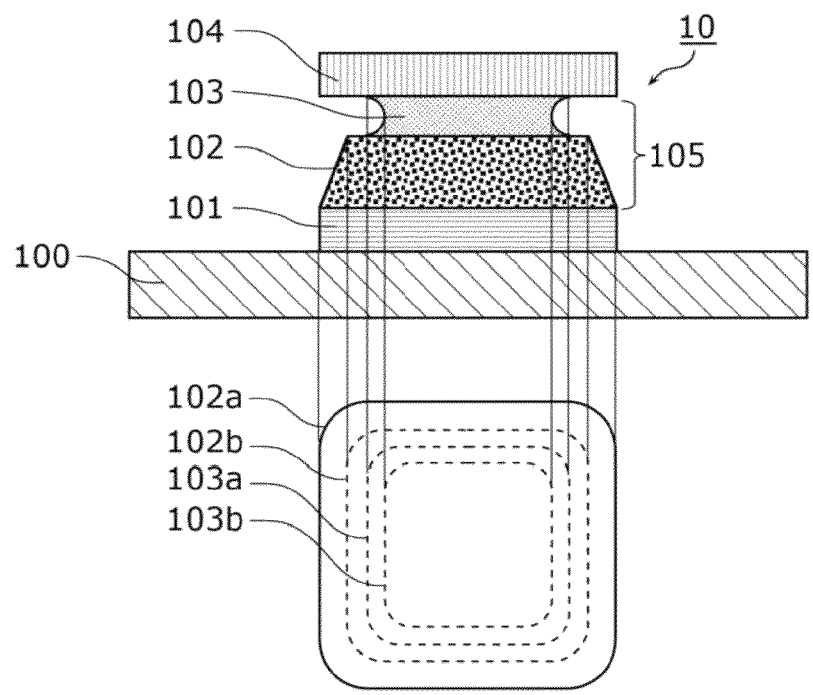

VARIABLE RESISTANCE NONVOLATILE MEMORY ELEMENT AND METHOD OF MANUFACTURING THE SAME

TECHNICAL FIELD

The present invention relates to a variable resistance nonvolatile memory element having a resistance value which is variable under application of a voltage pulse.

BACKGROUND ART

In recent years, electronic devices such as mobile information devices and information home appliances are becoming more sophisticated in functionality along with advancement of digital technology. Along with the more sophisticated functionality of the electronic devices, miniaturization and speed-enhancement of the semiconductor devices used in the electronic devices have been rapidly advanced. Among all, demand for nonvolatile memories with a large capacity represented by flash memories is expanding rapidly.

In addition, research and development of a nonvolatile memory device which uses a so-called variable resistance nonvolatile memory element has been advanced, the nonvolatile memory device being a new nonvolatile memory of the next generation which replaces the flash memory. Here, the variable resistance nonvolatile memory element is an element having a characteristic that a resistance value changes reversibly by electrical signals and being capable of storing data corresponding to the resistance value in a nonvolatile manner.

In order to make a variable resistance nonvolatile memory element switchable between a high resistance state and a low resistance state under application of electrical pulses, it is necessary to perform an electrical operation called forming. The forming herein refers to application of a voltage (forming voltage) higher than a normal write voltage to the variable resistance nonvolatile memory element having an extremely high resistance value after manufacture.

CITATION LIST

Patent Literature

[PTL 1] WO 2010/038442

SUMMARY OF INVENTION

Technical Problem

In order to stabilize the resistance change operation of a variable resistance nonvolatile memory element, a current (forming current), which flows when the variable resistance nonvolatile memory element is formed, is preferably small.

It is an object of the present invention to solve the above-mentioned problem and provide a variable resistance nonvolatile memory element capable of reducing the forming current and a method of manufacturing the variable resistance nonvolatile memory element.

Solution to Problem

In order to solve the above-mentioned problem, a variable resistance nonvolatile memory element according to an aspect of the present invention includes: a first electrode layer; a second electrode layer; a first variable resistance layer formed between the first electrode layer and the second electrode layer; and a second variable resistance layer interposed between the first variable resistance layer and one of the first electrode layer and the second electrode layer, the second variable resistance layer having a resistance value higher than a resistance value of the first variable resistance layer, wherein when the second variable resistance layer is viewed in a direction perpendicular to a major surface of the second variable resistance layer: an outline of the second variable resistance layer is located inwardly of an outline of any of the first variable resistance layer and the one of the first layer and the second electrode layer; and an outline of a face of the second variable resistance layer is located inwardly of an outline of a face of the first variable resistance layer, the face of the second variable resistance layer being in contact with the first variable resistance layer, the face of the first variable resistance layer being in contact with the second variable resistance layer.

A method of manufacturing a variable resistance nonvolatile memory element according to an aspect of the present invention includes: forming a first electrode material layer on a substrate; forming a first variable resistance material layer on the first electrode material layer; forming a second variable resistance material layer above the first electrode material layer, the second variable resistance material layer having a resistance value higher than a resistance value of the first variable resistance material layer; forming a second electrode material layer on the first variable resistance material layer and the second variable resistance material layer; forming a first electrode layer by processing the first electrode material layer; forming a second electrode layer by processing the second electrode material layer; forming a first variable resistance layer by processing the first variable resistance material layer; and forming a second variable resistance layer by processing the second variable resistance material layer, wherein in the forming of the first electrode layer, the forming of the second electrode layer, the forming of the first variable resistance layer, and the forming of the second variable resistance layer, when the second variable resistance layer is viewed in a direction perpendicular to a major surface of the substrate: an outline of the second variable resistance layer is displaced inwardly from an outline of any one of the second electrode layer and the first variable resistance layer; and an outline of a face of the second variable resistance layer, the face being in contact with the first variable resistance layer, is displaced inwardly from an outline of a face of the first variable resistance layer, the face being in contact with the second variable resistance layer.

Advantageous Effects of Invention

According to the present invention, a variable resistance nonvolatile memory element capable of reducing the forming current and a method of manufacturing the variable resistance nonvolatile memory element are provided.

BRIEF DESCRIPTION OF THE FIGURES

[FIG. 1] FIG. 1 is a schematic diagram illustrating the configuration of the variable resistance nonvolatile memory element described in PTL 1.

[FIG. 2] FIG. 2 is a graph illustrating a relationship between forming current and area of a variable resistance nonvolatile memory element.

[FIG. 3] FIG. 3 is a cross-sectional view illustrating the schematic configuration of a variable resistance nonvolatile memory element according to an embodiment.

[FIG. 4] FIG. 4 is a schematic diagram illustrating a positional relationship between the outline of a second variable resistance layer and the outlines of a first electrode layer, a second electrode layer, and a first variable resistance layer in the variable resistance nonvolatile memory element according to the embodiment.

FIG. 5 is a graph indicating a difference in variable resistance characteristic due to a difference in forming current.

[FIG. 7] (a) to (e) of FIG. 7 are cross-sectional views illustrating the steps in a method of manufacturing the variable resistance nonvolatile memory element according to the embodiment. (a) of FIG. 7 is a diagram illustrating a step of forming a first electrode material layer on a substrate. (b) of FIG. 7 is a diagram illustrating a step of forming a first variable resistance material layer on the first electrode material layer. (c) of FIG. 7 is a diagram illustrating a step of forming a second variable resistance material layer on the first variable resistance material layer. (d) of FIG. 7 is a diagram illustrating a step of forming a second electrode material layer on the second variable resistance material layer. (e) of FIG. 7 is a diagram illustrating a step of forming a variable resistance nonvolatile memory element by patterning and processing, the variable resistance nonvolatile memory element including the first electrode layer, the first variable resistance layer, the second variable resistance layer, and the second electrode layer.

[FIG. 8] FIG. 8 is a diagram illustrating the relationship between the outline of the second electrode layer and the outline of the second variable resistance layer when the dimension of the second electrode layer changes in the direction of film thickness in a step of processing the variable resistance nonvolatile memory element.

[FIG. 9] FIG. 9 is a diagram illustrating the relationship between the outline of the first variable resistance layer and the outline of the second variable resistance layer when the dimension of the first variable resistance layer changes in the direction of film thickness in the step of processing the variable resistance nonvolatile memory element.

FIG. 10 is a SEM (Scanning Electron Microscope) image of a cross section of a variable resistance nonvolatile memory element having an etched side portion.

FIG. 11 is a cross-sectional view illustrating the steps in the method of manufacturing the variable resistance nonvolatile memory element. (a) of FIG. 11 is a diagram illustrating the process of forming a variable resistance nonvolatile memory element by patterning and processing, the variable resistance nonvolatile memory element including the first electrode layer, the first variable resistance layer, the second variable resistance layer, and the second electrode layer. (b) of FIG. 11 is a diagram illustrating a step of forming a variable resistance nonvolatile memory element by side-etching the second variable resistance layer.

FIG. 12 is a cross-sectional view illustrating another schematic configuration of a variable resistance nonvolatile memory element according to the embodiment.

FIG. 14 is a schematic diagram illustrating a configuration of is a variable resistance nonvolatile memory element having a support layer.

FIG. 15 is a schematic diagram illustrating another configuration of the variable resistance nonvolatile memory element having a support layer.

FIG. 16 is a schematic diagram illustrating still another configuration of the variable resistance nonvolatile memory element having a support layer.

DESCRIPTION OF EMBODIMENTS

Knowledge for Foundation of Present Invention

Figure 5:
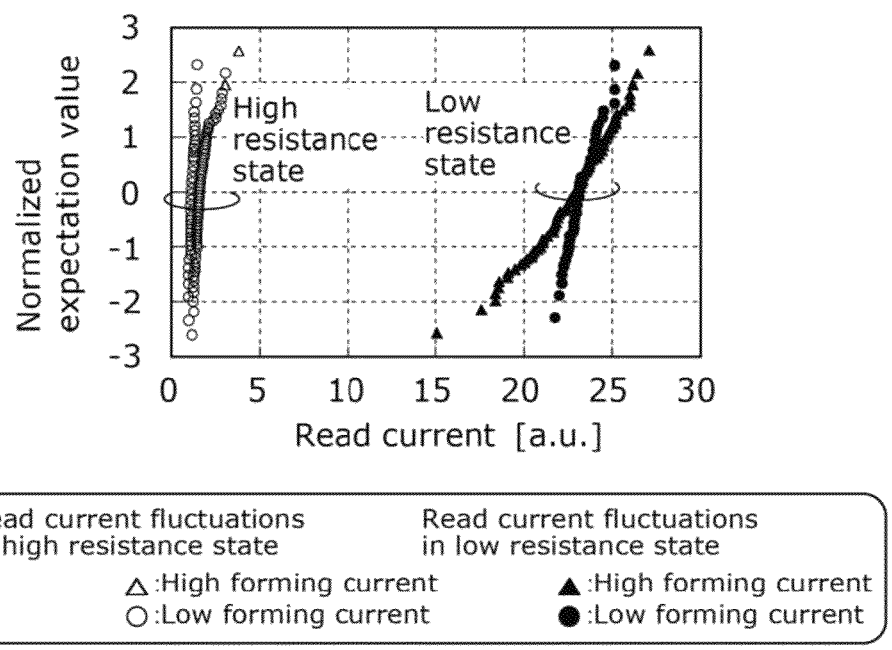
[FIG. 5]

As an example of a variable resistance nonvolatile memory element, PTL 1 discloses a variable resistance nonvolatile memory element in which a variable resistance layer is formed by stacking oxide layers having different oxygen content percentages.

FIG. 1 is a schematic diagram illustrating the configuration of the variable resistance nonvolatile memory element described in PTL 1.

In FIG. 1, on a substrate 200, a variable resistance nonvolatile memory element 20 includes a first electrode layer 201, a second electrode layer 204, and a variable resistance layer 205 interposed between the first electrode layer 201 and the second electrode layer 204. In addition, the variable resistance layer 205 has a stacked layer structure including at least two layers: a first variable resistance layer 202 and a second variable resistance layer 203.

The second variable resistance layer 203 is an insulating material immediately after manufacture. In order to make the variable resistance nonvolatile memory element 20 switchable between a high resistance state and a low resistance state under application of electrical pulses, it is necessary to cause breakdown of the second variable resistance layer 203 by an electrical process called forming so as to form a conductive path in the variable resistance layer 205. The forming herein refers to application of a voltage (forming voltage) higher than a normal write voltage to the variable resistance nonvolatile memory element 20 after manufacture, which has an extremely high resistance value.

FIG. 2 illustrates an example of relationship between a current (forming current) which flows when forming is performed on the variable resistance nonvolatile memory element 20, and a cross-sectional area (element area) of the variable resistance layer 205 of the variable resistance nonvolatile memory element 20 taken along a plane parallel to the major surface of the substrate 200.

As illustrated in FIG. 2, the forming current depends on the element area. Therefore, a variable resistance nonvolatile memory element preferably has a small area in order to reduce the forming current.

However, the element area of a variable resistance nonvolatile memory element depends on the design rule for a semiconductor process, and it is difficult to reduce the element area lower than what is determined by the design rule.

It is an object of the present invention to solve the above-mentioned problem and provide a variable resistance nonvolatile memory element capable of reducing the forming current while maintaining the design rule for the semiconductor process and a method of manufacturing the variable resistance nonvolatile memory element.

In order to solve the above-mentioned problem, a variable resistance nonvolatile memory element according to an aspect of the present invention includes: a first electrode layer; a second electrode layer; a first variable resistance layer formed between the first electrode layer and the second electrode layer; and a second variable resistance layer interposed between the first variable resistance layer and one of the first electrode layer and the second electrode layer, the second variable resistance layer having a resistance value higher than a resistance value of the first variable resistance layer, wherein when the second variable resistance layer is viewed in a direction perpendicular to a major surface of the second variable resistance layer: an outline of the second variable resistance layer is located inwardly of an outline of any of the first variable resistance layer and the one of the first layer and the second electrode layer; and an outline of a face of the second variable resistance layer is located inwardly of an outline of a face of the first variable resistance layer, the face of the second variable resistance layer being in contact with the first variable resistance layer, the face of the first variable resistance layer being in contact with the second variable resistance layer.

When a variable resistance layer is formed by stacking the first variable resistance layer and the second variable resistance layer having different resistance values, the value of the forming current is equal to the current which is necessary to cause breakdown of one of the variable resistance layers having a higher resistance value.

Therefore, the forming current can be reduced by decreasing the element area of the second variable resistance layer having a resistance value higher than the resistance value of the first variable resistance layer.

The thickness of the second variable resistance layer in the direction may be thinner than the thickness of the first variable resistance layer in the direction, for example, Such a configuration allows the first variable resistance layer to support the variable resistance nonvolatile memory element, and the possibility of collapse of the element due to the decreased element area of the second variable resistance layer is reduced. In addition, the forming current can be further reduced by decreasing the thickness of the second variable resistance layer.

The first variable resistance layer may have electrical conductivity, for example.

When the first variable resistance layer has electrical conductivity, breakdown by the forming is necessary only for the second variable resistance layer. Thus, the forming is to be performed only on the second variable resistance layer, thus the effect of reduced forming current caused by decreased area of the second variable resistance layer can be maximized.

The variable resistance nonvolatile memory element may, for example, include a support layer which is disposed so as to cover the periphery of the second variable resistance layer, and the band gap of a material which comprises the support layer may be greater than the band gap of a material which comprises the second variable resistance layer.

Forming such a support layer can prevent collapse of the element more reliably. In general, a material having a greater band gap has a higher breakdown voltage. For this reason, when a conductive path is formed by the forming, breakdown of the second variable resistance layer is selectively caused, so that a conductive path is formed only in the second variable resistance layer. Thus, the support layer does not contribute to a resistance change operation.

The support layer may, for example, comprise an insulating material, and the thickness of the support layer in the direction may be thicker than the thickness of the second variable resistance layer in the direction.

Forming such a support layer can prevent collapse of the element more reliably. In addition, breakdown of the support layer is not caused at the time of forming by making the thickness of the support layer thicker than the thickness of the second variable resistance layer, thus a conductive path is formed only in the second variable resistance layer. Thus, the support layer does not contribute to a resistance change operation.

The metal contained in a metal oxide which comprises the first variable resistance layer may be, for example, the same as the metal contained in a metal oxide which comprises the second variable resistance layer, and the degree of oxygen deficiency of the metal oxide which comprises the first variable resistance layer may be greater than the degree of oxygen deficiency of the metal oxide which comprises the second variable resistance layer.

In this manner, by using the first variable resistance layer and the second variable resistance layer having different degrees of oxygen deficiency, the respective etching rates (likelihood of etching) of the variable resistance layers can be different. Thus, it becomes easy to selectively side-etch only the second variable resistance layer.

The metal contained in the metal oxide which comprises the first variable resistance layer may be different from the metal contained in the metal oxide which comprises the second variable resistance layer, and the standard electrode potential of the metal contained in the metal oxide which comprises the first variable resistance layer may be higher than the standard electrode potential of the metal contained in the metal oxide which comprises the second variable resistance layer.

In this manner, by using the first variable resistance layer and the second variable resistance layer having different metallic elements contained therein, the respective etching rates of the variable resistance layers can be different. Thus, it becomes easy to selectively side-etch only the second variable resistance layer.

A method of manufacturing a variable resistance nonvolatile memory element according to an aspect of the present invention includes: forming a first electrode material layer on a substrate; forming a first variable resistance material layer on the first electrode material layer; forming a second variable resistance material layer above the first electrode material layer, the second variable resistance material layer having a resistance value higher than a resistance value of the first variable resistance material layer; forming a second electrode material layer on the first variable resistance material layer and the second variable resistance material layer; forming a first electrode layer by processing the first electrode material layer; forming a second electrode layer by processing the second electrode material layer; forming a first variable resistance layer by processing the first variable resistance material layer; and forming a second variable resistance layer by processing the second variable resistance material layer, wherein in the forming of the first electrode layer, the forming of the second electrode layer, the forming of the first variable resistance layer, and the forming of the second variable resistance layer, when the second variable resistance layer is viewed in a direction perpendicular to a major surface of the substrate:

an outline of the second variable resistance layer is displaced inwardly from an outline of any one of the second electrode layer and the first variable resistance layer; and an outline of a face of the second variable resistance layer, the face being in contact with the first variable resistance layer, is displaced inwardly from an outline of a face of the first variable resistance layer, the face being in contact with the second variable resistance layer.

For example, the forming of the first electrode layer, the forming of the second electrode layer, the forming of the first variable resistance layer, and the forming of the second variable resistance layer may be performed in a single etching process at the same time.

By using the aforementioned manufacturing method, the variable resistance nonvolatile memory element can be formed and the area of the second variable resistance layer can be reduced. Thus, the manufacturing process can be shortened and the manufacturing cost can be reduced.

For example, the forming of the first electrode layer, the forming of the second electrode layer, and the forming of the first variable resistance layer may be performed in a single etching process at the same time, and in the forming of the second variable resistance layer subsequent to the single etching process, the second variable resistance material layer may be further selectively etched, and the second variable resistance layer may be formed.

By using the aforementioned manufacturing method, appropriate etching conditions for forming the second variable resistance layer can be individually set.

Hereinafter, an embodiment will be described with reference to the drawings.

It is to be noted that each embodiment described below represents a comprehensive or specific example. Numerical values, shapes, materials, components, arrangement positions and connection configurations of the components, steps, the order of the steps shown in the following embodiment provide an example, and are not intended to limit the present invention. Any component not recited in the independent claim out of the components in the following embodiment will be described as an arbitrary component the independent claim providing the most generic concept.

Embodiment

Configuration of Variable Resistance Nonvolatile Memory Element 10

First, the configuration of a variable resistance nonvolatile memory element according to the embodiment will be described. In the present embodiment, the variable resistance nonvolatile memory element is assumed to be bidirectional and has a resistance value which changes under application of voltages or currents having is different polarities, higher than or equal to a predetermined threshold value.

FIG. 3 is a cross-sectional view illustrating the schematic configuration of a variable resistance nonvolatile memory element 10 according to the embodiment. FIG. 3 is a cross-sectional view of the variable resistance nonvolatile memory element 10 taken along a plane perpendicular to the major surface of a substrate.

As illustrated in FIG. 3, the variable resistance nonvolatile memory element 10 includes a first electrode layer 101 formed on a substrate 100 on which a transistor and the like are formed, a variable resistance layer 105 formed on the first electrode layer 101, and a second electrode layer 104 formed on the variable resistance layer 105.

The variable resistance layer 105 includes at least two layers: a first variable resistance layer 102 and a second variable resistance layer 103. The second variable resistance layer 103 is in contact with the second electrode layer 104. Here, the resistance value of the second variable resistance layer 103 is higher than the resistance value of the first variable resistance layer 102.

FIG. 4 illustrates the relationship between the outline of the second variable resistance layer 103 and the outlines of the first electrode layer 101, the second electrode layer 104, and the first variable resistance layer 102 as viewed in the direction perpendicular to the major surface of the substrate 100.

As illustrated in FIG. 4, the outline 103a of the second variable resistance layer as viewed in the direction perpendicular to the major surface of the substrate 100 indicates the outer shape of the second variable resistance layer as viewed in the direction perpendicular to the major surface of the substrate 100. Hereinafter, the outlines of the first electrode layer 101, the first variable resistance layer 102, and the second electrode layer 104 are defined similarly.

An outline 103a of the second variable resistance layer 103 is located inwardly of an outline 104a of the second electrode layer 104 as viewed in the direction perpendicular to the major surface of the substrate 100 (the second variable resistance layer 103). In other words, the outline 103a of the second variable resistance layer 103 is inwardly displaced from the outline 104a of the second electrode layer 104. That is to say, the cross-sectional area (element area) of the second variable resistance layer 103 taken along a plane parallel to the major surface of the substrate 100 is smaller than the element area of the second electrode layer 104.

In other words, in the cross-section of the variable resistance nonvolatile memory element 10 taken along a plane parallel to the major surface of the substrate 100, the shape of the outer peripheral surface of the second variable resistance layer 103 is located inwardly of the shape of the outer peripheral surface of the second electrode layer 104, and the shape of the outer peripheral surface of the first variable resistance layer 102.

It is to be noted that the present invention also includes the case where at least part of the outline 103a of the second variable resistance layer 103 is located inwardly of any one of the outline 101a of the first electrode layer 101 and the outline 104a of the second electrode layer 104.

Similarly, FIG. 4 illustrates the relationship between the outline 103a of the second variable resistance layer 103 and the outline 102a of the first variable resistance layer 102 as viewed in the direction in perpendicular to the major surface of the substrate 100.

The outline 103a of the second variable resistance layer 103 is located inwardly of the outline 102a of the first variable resistance layer 102 when viewed in the direction perpendicular to the major surface of the substrate 100. In other words, the outline 103a of the second variable resistance layer 103 is displaced inwardly from the outline 102a of the first variable resistance layer 102. That is to say, the element area of the second variable resistance layer 103 is smaller than the element area of the first variable resistance layer 102.

In the example of FIG. 4, the outline 102a of the first variable resistance layer 102 is the same as the outline 101a of the first electrode layer 101. Therefore, the outline 103a of the second variable resistance layer is located inwardly of the outline 101a of the first electrode layer 101. In other words, the outline 103a of the second variable resistance layer 103 is displaced inwardly from the outline 101a of the first electrode layer 101. That is to say, the element area of the second variable resistance layer 103 is smaller than the element area of the first electrode layer 101.

The outline of a surface of the second variable resistance layer 103, the surface being in contact with the first variable resistance layer 102 is located inwardly of the outline of a surface of the first variable resistance layer 102, the surface being in contact with the second variable resistance layer 103.

It is to be noted that the present invention also includes the case where at least part of the outline of a surface of the second variable resistance layer 103, the surface being in contact with the first variable resistance layer 102 is located inwardly of the outline of a surface of the first variable resistance layer 102, the surface being in contact with the second variable resistance layer 103.

As illustrated in FIG. 4, the outline 103a of the second variable resistance layer 103 is displaced inwardly from any one of the outline 102a of the first variable resistance layer 102, the outline 101a of the first electrode layer 101, and the outline 104a of the second electrode layer 104. Therefore, the element area of the second variable resistance layer 103 is smaller than any one of the element areas of the first electrode layer 101, the second electrode layer 104 and the first variable resistance layer 102.

It is to be noted that the outline 102a of the first variable resistance layer may be located inwardly of any one of the outline 101a of the first electrode layer 101 and the outline 104a of the second electrode layer 104.

When the resistance value of the variable resistance layer 105 increases, a larger amount of current needs to flow in order to form a conductive path by forming. For this reason, when the first variable resistance layer 102 and the second variable resistance layer 103 having different resistance values are stacked to form the variable resistance layer 105, the value of the forming current is equal to the current necessary to cause breakdown of the second variable resistance layer 103 having a higher resistance value.

Consequently, in the variable resistance nonvolatile memory element 10 illustrated in FIG. 3, the forming current can be reduced according to the result illustrated in FIG. 2 by setting the element area of the second variable resistance layer 103 to be smaller than the element area of the first variable resistance layer 102. In addition, the resistance change operation can be stabilized by reducing the forming current.

FIG. 5 is a graph illustrating the effect of reduced forming current on stability of variable resistance characteristic.

In FIG. 5, in order to determine the stability of the variable resistance characteristic, fluctuations of read current are evaluated, the read current being measured when the variable resistance nonvolatile memory element, on which forming with a corresponding forming current is performed, is continuously changed in resistance. As illustrated in FIG. 5, the fluctuations of the read current in a low resistance state and a high resistance state are decreased by the reduced forming current. This is presumably because a filament with a high defect density is formed by the reduced forming current, thus a conductive path has increased conductivity.

In addition, the variable resistance nonvolatile memory element 10 can be supported by the first variable resistance layer 102 by setting the thickness (film thickness) of the second variable resistance layer 103 in the direction perpendicular to the major surface of the substrate 100 to be thinner than the film thickness of the first variable resistance layer 102.

Thus, the variable resistance nonvolatile memory element 10 can have a stable structure which is not likely to collapse. The forming current can be further reduced by decreasing the film thickness of the second variable resistance layer 103. From the viewpoint of reducing the forming current, the film thickness of the second variable resistance layer 103 is preferably 10 nm or less.

The first variable resistance layer 102 may have electrical conductivity.

When the first variable resistance layer 102 has electrical conductivity, breakdown by the forming is necessary only for the second variable resistance layer 103. Thus, the forming is to be performed on only the second variable resistance layer 103, and the effect of reduced forming current caused by decreased element area of the second variable resistance layer 103 can be maximized. It is to be noted that having electrical conductivity specifically means that corresponding electrical resistivity is 10 Ωcm or less.

Figure 6:
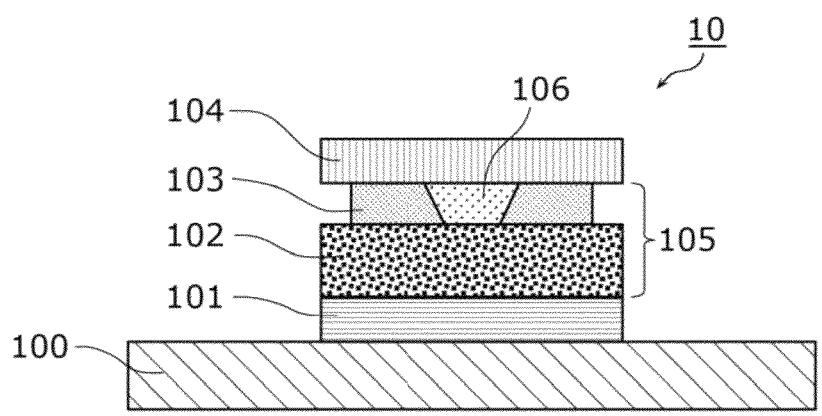
[FIG. 6]πFIG. 6 is a diagram schematically illustrating the manner in which forming is performed on a variable resistance nonvolatile memory element and a conductive path is formed.

FIG. 6 illustrates a schematic diagram when a conductive path 106 is formed in the second variable resistance layer 103 by performing forming on the variable resistance nonvolatile memory element 10.

As illustrated in FIG. 6, the conductive path 106 is formed in the second variable resistance layer 103 by the forming, and the resistance value of the conductive path 106 becomes lower than the resistance value of the second variable resistance layer 103. When the first resistance variable layer 102 has electrical conductivity, it is presumed that the conductive path 106 is formed in the second resistance variable layer 103 as illustrated in FIG. 6.

As described above, by setting the element area of the second variable resistance layer 103 to be smaller than the element area of the first variable resistance layer 102, the forming current can be effectively reduced while maintaining the design rule for the semiconductor process. In this case, because the film thickness of the second variable resistance layer 103 is thin, the possibility of collapse of the element can be reduced by decreasing the element area of only the second variable resistance layer 103 rather than decreasing the element area of the entire variable resistance layer 105.

[Method of Manufacturing Variable Resistance Nonvolatile Memory Element 10]

Next, a method of manufacturing the variable resistance nonvolatile memory element 10 according to the embodiment will be described.

(a) to (e) of FIG. 7 are schematic diagrams illustrating an example of the method of manufacturing the variable resistance nonvolatile memory element 10 according to the embodiment.

First, as illustrated in (a) of FIG. 7, a first electrode material layer 101' which subsequently becomes the first electrode layer 101 is formed on a substrate on which a transistor and the like are formed.

Next, as illustrated in (b) of FIG. 7, a first variable resistance material layer 102' which subsequently becomes the first variable is resistance layer 102 is formed on the first electrode material layer 101'.

Next, as illustrated in (c) of FIG. 7, a second variable resistance material layer 103' which subsequently becomes the second variable resistance layer 103 is formed. A variable resistance material layer 105' has a stacked layer structure including at least two layers: the first variable resistance material layer 102' and the second variable resistance material layer 103'.

Next, as illustrated in (d) of FIG. 7, a second electrode material layer 104' which subsequently becomes the second electrode layer 104 is formed.

Next, as illustrated in (e) of FIG. 7, patterning in a desired shape is performed by masking and photolithography, and then the first electrode material layer 101', the first variable resistance material layer 102', the second variable resistance material layer 103' and the second electrode material layer 104' are processed by dry etching. The dry etching is performed in a single etching process at the same time. As a result, the variable resistance nonvolatile memory element 10 including the first electrode layer 101, the first variable resistance layer 102, the second variable resistance layer 103 and the second electrode layer 104 is completed.

In the step illustrated in (e) of FIG. 7, dry etching is performed under the conditions such that the etching rate (likelihood of etching) of the second variable resistance material layer 103' is set to be higher than the etching rates of the first variable resistance material layer 102', the first electrode material layer 101', and the second electrode material layer 104'. Thus, the peripheral portion of the second variable resistance material layer 103' is etched rather than other material layers. That is to say, the second variable resistance material layer 103' is selectively side-etched, and the shape of the variable resistance nonvolatile memory element 10 illustrated in FIG. 3 can be achieved.

In the step illustrated in (e) of FIG. 7, there may be a case where the outer peripheral surface of the second electrode layer 104 and the outer peripheral surface of the first variable resistance layer 102 are not uniform in the direction perpendicular to the major surface of the substrate 100 depending on the etching conditions. That is to say, there may be a case where the element area of the second electrode layer 104 and the element area of the first variable resistance layer 102 are not uniform in the direction perpendicular to the major surface of the substrate 100. For example, there may be a case where time periods for which dry etching is performed are different depending on etched portions of the variable resistance nonvolatile memory element 10.

The example illustrated in FIG. 8 shows a structural example of the variable resistance nonvolatile memory element 10 in which the element area of the second electrode layer 104 increases as the element area is closer to the substrate 100.

In the above case, the outline 104a of the second electrode layer 104 is the largest outline among the outlines of the cross sections of the second electrode layer 104 taken along planes parallel to the major surface of the substrate 100. In the example of FIG. 8, the outline 104a of the second electrode layer 104 is the outline of the cross section for which the element area of the second electrode layer 104 is the greatest.

Similarly, the example illustrated in FIG. 9 shows a structural example of the variable resistance nonvolatile memory element 10 in which the element area of the first variable resistance layer 102 increases as the element area is closer to the substrate 100.

Similarly, in this case, the outline 102a of the first variable resistance layer 102 is the largest outline among the outlines of the cross sections of the first variable resistance layer 102 taken along planes parallel to the major surface of the substrate 100.

In the example illustrated in FIG. 9, the outline 102a of the first variable resistance layer 102 is the outline of a cross section having the greatest element area of the first variable resistance layer 102.

In FIG. 9, the lateral surface (the outer peripheral surface) of the second variable resistance layer 103 is a curved surface such that the central portion of the surface in the stacking direction is recessed. In other words, the element area of the second variable resistance layer 103 has a minimum at the central portion of the second variable resistance layer 103 in the direction perpendicular to the major surface of the substrate 100.

Similarly, in this case, the outline 103a of the second variable resistance layer 103 is the largest outline among the outlines of the cross sections of the second variable resistance layer 103 taken along planes parallel to the major surface of the substrate 100.

In the example illustrated in FIG. 9, the outline 103a of the second variable resistance layer 103 is the outline of a cross section having the greatest element area of the second variable resistance layer 103.

In this case, the outline 103b at a cross section for which the element area of the second variable resistance layer 103 has a minimum is smaller than the outline 103a of a surface of the second variable resistance layer 103, the surface being in contact with the first variable resistance layer 102. Similarly, the outline 103b at a cross section for which the element area of the second variable resistance layer 103 has a minimum is smaller than the outline 103a of a surface of the second variable resistance layer 103, the surface being in contact with the second electrode layer 104.

In addition, the outline 103a of a surface of the second variable resistance layer 103, the surface being in contact with the first variable resistance layer 102 is located inwardly of the outline 102b of a surface of the first variable resistance layer 102, the surface being in contact with the second variable resistance layer 103.

In any case, the outline 103b of the second variable resistance layer 103 is located inwardly of the outline 102a of the first variable resistance layer 102 and the outline 104a of the second electrode layer 104, the effect of reduced forming current may be obtained.

[Specific Configuration of Variable Resistance Nonvolatile Memory Element 10 and Method of Manufacturing the Same]

Next, more specific configuration of the variable resistance nonvolatile memory element 10 according to the embodiment and a method of manufacturing the variable resistance nonvolatile memory element 10 will be described.

Figure 10:
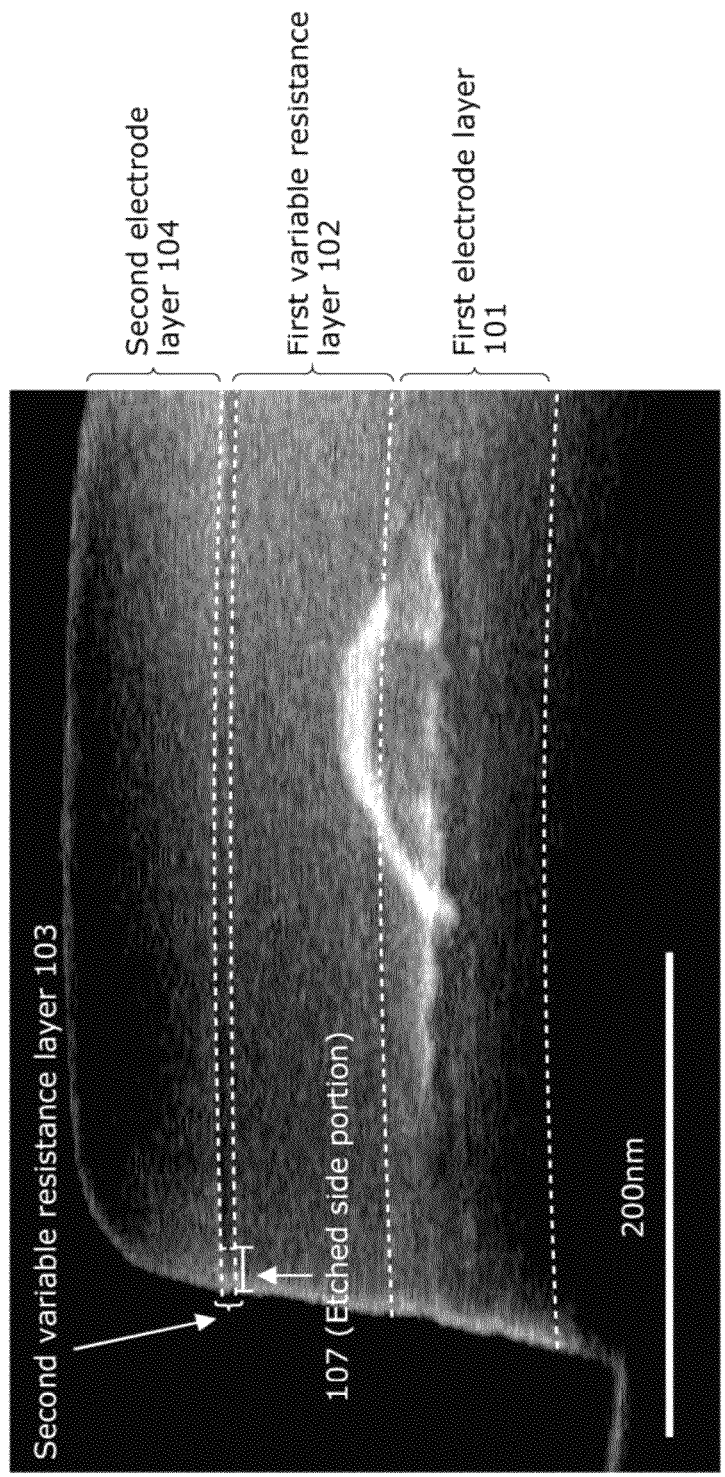
[FIG. 10]

FIG. 10 is a SEM image of a cross section of the variable resistance nonvolatile memory element 10 which is formed by the manufacturing method illustrated in (a) to (e) of FIG. 7.

The method of manufacturing the variable resistance nonvolatile memory element 10 illustrated in FIG. 10 is the same as the manufacturing steps illustrated in FIG. 7.

First, in the step illustrated in (a) of FIG. 7, titanium nitride and tantalum nitride were formed as the first electrode material layer 101' with target film thicknesses of 20 nm and 30 nm by CVD method and sputtering method, respectively.

Next, in the step illustrated in (b) of FIG. 7, oxygen-deficient tantalum oxide with a target film thickness of 50 nm was formed as the first variable resistance material layer 102'. The oxygen-deficient tantalum oxide was formed using a sputtering target of tantalum by a reactive sputtering method which uses argon (Ar) and oxygen ($O_2$) as a sputtering gas. As a result of composition analysis performed by RBS method, x=1.6 was satisfied where the composition of oxygen-deficient tantalum oxide is expressed as $TaO_x$. The electrical resistivity of oxygen-deficient tantalum oxide was 6 mΩcm, and it was verified that the oxygen-deficient tantalum oxide had electrical conductivity.

Next, in the step illustrated in (c) of FIG. 7, aluminum oxide with a target film thickness of 6 nm was formed as the second variable resistance material layer 103' using aluminum oxide as a target, the aluminum oxide having a composition expressed by $Al_2O_3$.

Next, in the step illustrated in (d) of FIG. 7, iridium with a target film thickness of 80 nm was formed as the second electrode material layer 104' by sputtering method.

Next, in the step illustrated in (e) of FIG. 7, patterning by masking and photolithography was performed, so that the element dimension (diameter of the variable resistance nonvolatile memory element 10) is 380 nm, and the second electrode material layer 104' was processed by dry etching. Dry etching of the second electrode material layer 104' (iridium) was performed under the following conditions: a mixed gas of $Cl_2$ (60 sccm), Ar (170 sccm), and $O_2$ (30 sccm) was used, pressure was 0.3 Pa, ICP was 1500 W, and substrate draw bias was 600 W.

Next, the second variable resistance material layer 103' and the first variable resistance material layer 102' were processed. The conditions of dry etching were as follows: a mixed gas of $SF_6$ (70 sccm) and HBr (20 sccm) was used, pressure was 1.0 Pa, ICP was 300 W, and substrate draw bias was 200 W.

Next, the first electrode material layer 101' (tantalum nitride and titanium nitride) was processed.

The conditions of dry etching were as follows: a mixed gas of $Cl_2$ (150 sccm), Ar (300 sccm), and $CHF_3$ (5 sccm) was used, pressure was 0.5 Pa, ICP was 700 W, and substrate draw bias was 200 W. In the above conditions for dry etching, the etching rate for aluminum oxide is higher than the etching rate for oxygen-deficient tantalum oxide. Consequently, as illustrated in FIG. 10, the second variable resistance layer 103 (aluminum oxide) was selectively etched, and an etched side portion 107 was formed. The length of the etched side portion illustrated in FIG. 10 is approximately 20 nm, and in the variable resistance nonvolatile memory element having an element dimension of 380 nm, the element area of the second variable resistance layer 103 is reduced by approximately 20% in contrast to the element areas of other layers.

[Modification of Method of Manufacturing Variable Resistance Nonvolatile Memory Element 10]

Next, a modification of the method of manufacturing the variable resistance nonvolatile memory element 10 according to the embodiment will be described.

In the step illustrated in (e) of FIG. 7, the etched side portion 107 illustrated in FIG. 10 is formed at the same time with the processing of the variable resistance nonvolatile memory element 10. A step of forming the etched side portion 107 may be provided after the processing of the variable resistance nonvolatile memory element 10.

Figure 11:
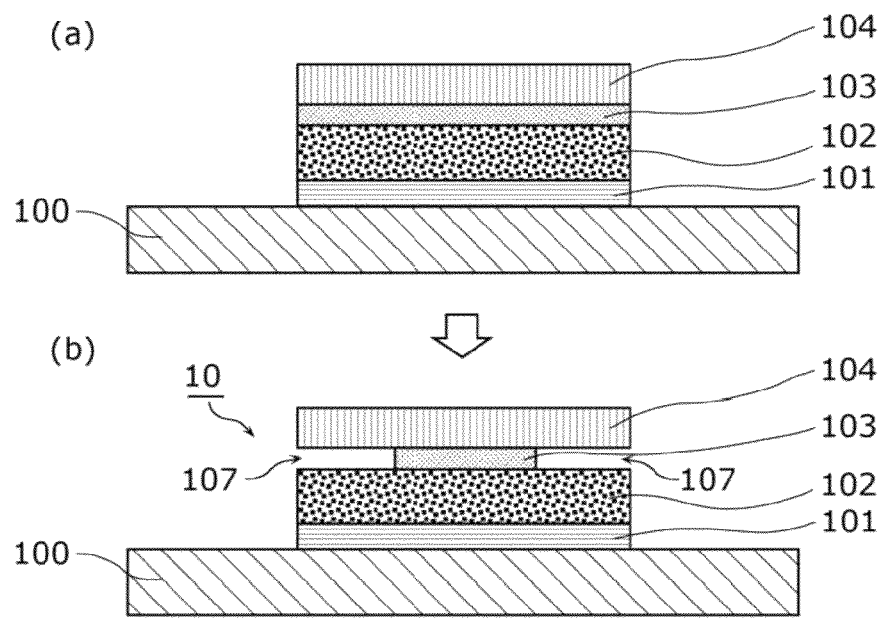
[FIG. 11]

The schematic diagram of the manufacturing method is illustrated in (a) and (b) of FIG. 11. The manufacturing process before (a) of FIG. 11 is the same as what is illustrated in (a) to (d) of FIG. 7, thus is omitted.

The step illustrated in (a) of FIG. 11 is a process of forming a variable resistance nonvolatile memory element by simultaneously is processing the first electrode material layer 101', the first variable resistance material layer 102', the second variable resistance material layer 103', and the second electrode material layer 104' in a single etching process, the variable resistance nonvolatile memory element including the first electrode layer 101, the first variable resistance layer 102, the second variable resistance layer 103, and the second electrode layer 104. In the step illustrated in FIG. 11 (a), the etched side portion 107 is not provided in the second variable resistance layer 103.

Next, in the step of (b) of FIG. 11, the second variable resistance layer 103 (the second variable resistance material layer 103') is further etched selectively so as to provide an etched side portion, thereby reducing the element dimension of the second variable resistance layer 103, and the variable resistance nonvolatile memory element 10 is completed.

As the processing method in this case, wet etching may be used or dry etching with reduced output of substrate draw bias may be used. For example, when the etched side portion 107 is formed by the dry etching with reduced output of substrate draw bias, etching in a direction to the substrate is not much in progress. Therefore, a time period for dry etching can be increased, and a larger etched side portion 107 illustrated in FIG. 10 can be formed.

[Another Example of Configuration of Variable Resistance Nonvolatile Memory Element]

In the variable resistance nonvolatile memory element 10 illustrated in FIG. 3, the second variable resistance layer 103 is disposed on the first variable resistance layer 102, however, the arrangement may be reversed. That is to say, the first variable resistance layer 102 may be disposed on the second variable resistance layer 103. A schematic configuration of a variable resistance nonvolatile memory element 11 having the above structure is illustrated in FIG. 12.

Figure 12:
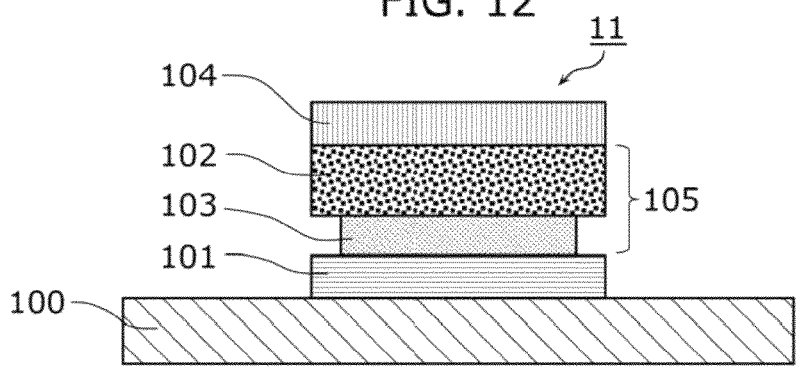
[FIG. 12]

As illustrated in FIG. 12, the variable resistance nonvolatile memory element 11 includes the first electrode layer 101 formed on the substrate 100 on which a transistor and the like are formed, the variable resistance layer 105 formed on the first electrode layer 101, and the second electrode layer 104 formed on the variable resistance layer 105.

The variable resistance layer 105 includes at least two layers: the second variable resistance layer 103 and the first variable resistance layer 102. The second variable resistance layer 103 is in contact with the first electrode layer 101. Here, the resistance value of the second variable resistance layer 103 is higher than the resistance value of the first variable resistance layer 102.

In addition, the outline of the second variable resistance layer 103 is located inwardly of the outlines of the first variable resistance layer 102 and the second electrode layer 104. Thus, even with the configuration of the variable resistance nonvolatile memory element 11, the effect of reduced forming current can be obtained for the same reason as in the variable resistance nonvolatile memory element 10.

[Method of Manufacturing Variable Resistance Nonvolatile Memory Element 11]

Figure 13:
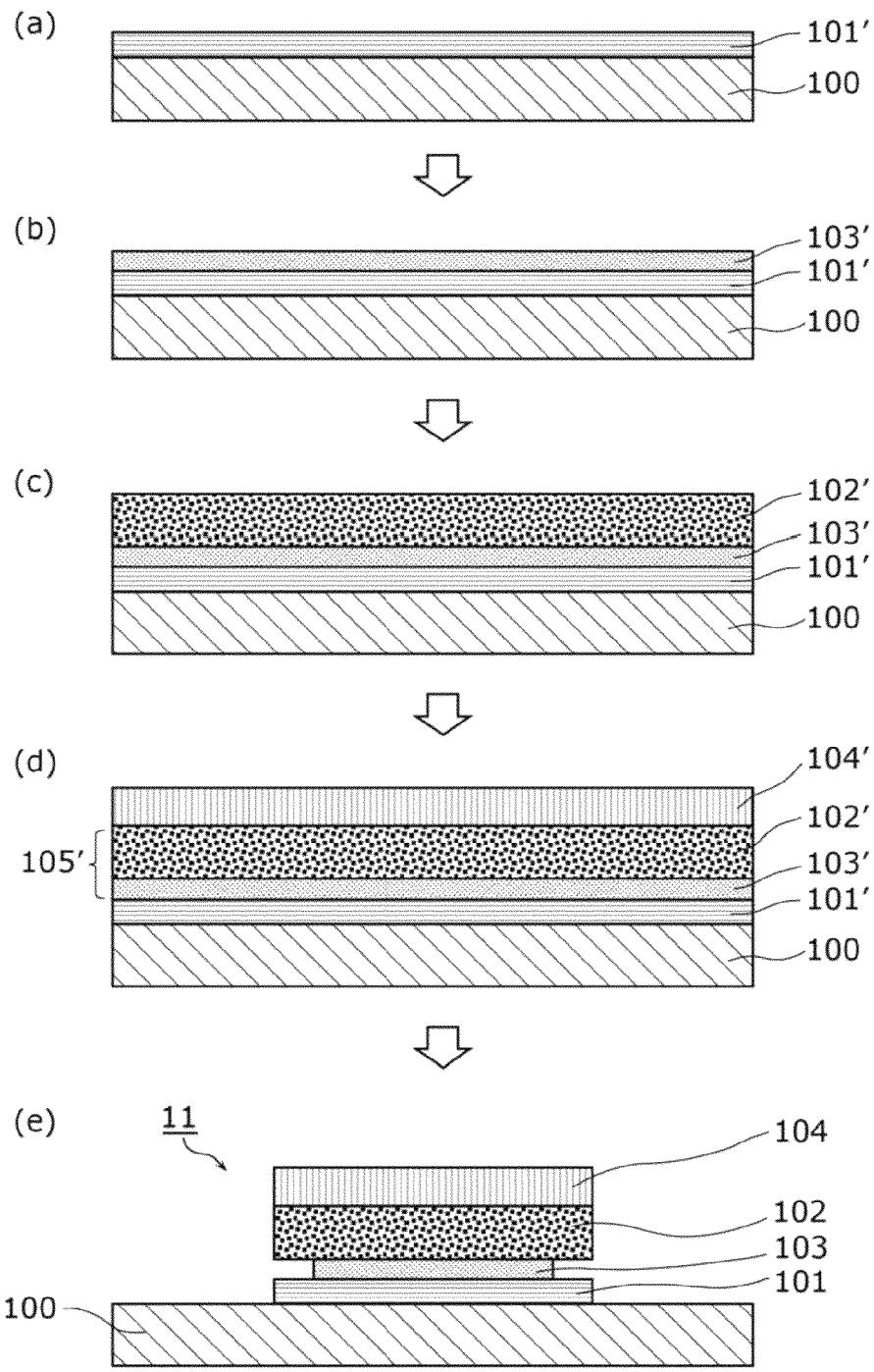
[FIG. 13] (a) to (e) of FIG. 13 are cross-sectional views illustrating the steps in another method of manufacturing the variable resistance nonvolatile memory element according to the embodiment. (a) of FIG. 13 is a diagram illustrating a step of forming a first electrode material layer on a substrate. (b) of FIG. 13 is a diagram illustrating a step of forming a second variable resistance material layer on the first electrode material layer. (c) of FIG. 13 is a diagram illustrating a step of forming a first variable resistance material layer on the second variable resistance material layer. (d) of FIG. 13 is a diagram illustrating a step of forming a second electrode material layer on the first variable resistance material layer. (e) of FIG. 7 is a diagram illustrating a step of forming a variable resistance nonvolatile memory element by patterning and processing, the variable resistance nonvolatile memory element including the first electrode layer, the second variable resistance layer, the first variable resistance layer, and the second electrode layer.

Next, a summary of a method of manufacturing the variable resistance nonvolatile memory element 11 shown in FIG. 12 is illustrated in FIG. 13.

(a) to (e) of FIG. 13 are schematic diagrams illustrating an example of the method of manufacturing the variable resistance in nonvolatile memory element 11 according to the embodiment.

First, as illustrated in (a) of FIG. 13, a first electrode material layer 101' which subsequently becomes the first electrode layer 101 is formed on a substrate on which a transistor and the like are formed.

Next, as illustrated in (b) of FIG. 13, a second variable resistance material layer 103' which subsequently becomes the second variable resistance layer 103 is formed on the first electrode material layer 101'.

Next, as illustrated in (c) of FIG. 13, a first variable resistance material layer 102' which subsequently becomes the first variable resistance layer 102 is formed. A variable resistance material layer 105' has a stacked layer structure including at least two layers: the second variable resistance material layer 103' and the first variable resistance material layer 102'.

Next, as illustrated in (d) of FIG. 13, a second electrode material layer 104' which subsequently becomes the second electrode an layer 104 is formed.

Next, as illustrated in (e) of FIG. 13, patterning in a desired shape is performed by masking and photolithography, and then the first electrode material layer 101', the first variable resistance material layer 102', the second variable resistance material layer 103', the first variable resistance material layer 102', and the second electrode material layer 104' are processed by dry etching. The dry etching is performed in a single etching process at the same time. As a result, the variable resistance nonvolatile memory element 11 including the first electrode layer 101, the second variable resistance layer 103, the first variable resistance layer 102, and the second electrode layer 104 is completed.

In the dry etching in the step illustrated in (e) of FIG. 13, the dry etching is performed under the conditions such that the etching rate of the second variable resistance material layer 103' is set to be higher than the etching rates of the first variable resistance material layer 102', the first electrode material layer 101', and the second electrode material layer 104'. Thus, in the step illustrated in (e) of FIG. 13, the second variable resistance material layer 103' is selectively side-etched, and the shape of the variable resistance nonvolatile memory element 11 illustrated in FIG. 3 can be achieved.

[Material of Variable Resistance Layer]

In the steps illustrated in (e) of FIG. 7, (b) of FIG. 11, or (e) of FIG. 13, the first variable resistance material layer 102' and the second variable resistance material layer 103' preferably comprise different materials in order to selectively side-etch the second variable resistance material layer 103' without reducing the first variable resistance material layer 102'.

In FIG. 10, the example has been illustrated in which aluminum oxide is used as the second variable resistance material layer 103, and oxygen-deficient tantalum oxide is used as the first variable resistance layer 102. However, the materials comprised in the first variable resistance material layer 102' and the second variable resistance material layer 103' are not limited to these.

For example, the first variable resistance material layer 102' and the second variable resistance material layer 103' may comprise metal oxides having different degrees of oxygen deficiency. That is to say, the first variable resistance material layer 102' may comprise a metal oxide having a composition expressed by $MO_x$, and the second variable resistance material layer 103' may comprise a metal oxide having a composition expressed by $MO_y$ (x, y are positive numbers that satisfy x<y) where M is a metal element. Here, tantalum (Ta), titanium (Ti), hafnium (Hf), zirconium (Zr), niobium (Nb), tungsten (W), nickel (Ni), or the like may be used as the metal element M.

In addition, the resistance value of the first variable resistance material layer 102' can be lower than the resistance value of the second resistance variable material layer 103' by setting the degree of oxygen deficiency of the first variable resistance material layer 102' to be higher than the degree of oxygen deficiency of the second variable resistance material layer 103' (i.e., it is set that x<y).

Resistance change phenomenon observed when a voltage is applied to the variable resistance nonvolatile memory element 10 is presumed to occur in such a manner that an oxidation reduction reaction occurs in a tiny conductive path which is formed in the second variable resistance layer having a high resistance, so that the resistance value changes.

Therefore, when a voltage is applied to the variable resistance nonvolatile memory element 10 in the above configuration, more voltage is distributed to the second variable resistance layer 103 having a high resistance. Thus, an oxidation reduction reaction in the second variable resistance layer 103 side is likely to be caused, and a stable resistance change operation is achieved.

Because the degrees of oxygen deficiency of the second variable resistance material layer 103' and the first variable resistance material layer 102' differ from each other, a difference in the respective etching rates can be made when the second variable resistance material layer 103' and the first variable resistance material layer 102' are processed. Thus, only the second variable resistance layer 103 can be selectively side-etched.

The first variable resistance material layer 102' and the second variable resistance material layer 103' may comprise oxides of different metals. That is to say, the first variable resistance material layer 102' may comprise a metal oxide having a composition expressed by $M1O_{x'}$, and the second variable resistance material layer 103' may comprise a metal oxide having a composition expressed by $M2O_{y'}$ (x', y' are positive numbers) where M1 and M2 are different metal elements.

In this case, the standard electrode potential of the metal element M2 in the metal oxide which comprises the second variable resistance material layer 103' may be lower than the standard electrode potential of the metal element M1 in the metal oxide which comprises the first variable resistance material layer 102'.

For example, when oxygen-deficient tantalum oxide is used for the first variable resistance material layer 102', titanium oxide ($TiO_2$), hafnium oxide ($HfO_2$), or aluminum oxide ($Al_2O_3$) is used for the second variable resistance material layer 103'. Titanium (standard electrode potential=−1.63 eV), hafnium (standard electrode potential=−1.55 eV), and aluminum (standard electrode potential=−1.68 eV) are materials each having a standard electrode potential lower than the standard electrode potential of tantalum (standard electrode potential=−0.6 eV).

A higher value of standard electrode potential of a metal indicates higher oxidation resistant characteristics. A metal oxide is disposed on the second variable resistance material layer 103', the metal oxide having a standard electrode potential lower than the standard electrode potential of the first variable resistance material layer 102', and thus an oxidation reduction reaction in the second variable resistance layer 103 side is likely to be caused in the variable resistance nonvolatile memory element 10.

As described above, resistance change phenomenon is presumed to occur in such a manner that an oxidation reduction reaction occurs in a tiny conductive path which is formed in the second variable resistance layer having a high resistance, so that the resistance value changes. Thus, an oxidation reduction reaction in the second variable resistance layer 103 side is likely to be caused, and a stable resistance change operation is achieved.

Because the first variable resistance layer 102 and the second variable resistance layer 103 contain different metal elements, a difference in the respective etching rates can be made when the second variable resistance layer 103 and the first variable resistance layer 102 are processed. For this reason, only the second variable resistance layer 103 can be selectively side-etched.

[Material of Electrode Layer]

The second electrode layer 104, which is connected to the second variable resistance layer 103 having a lower degree of oxygen deficiency, comprises a material such as platinum (Pt), iridium (Ir), or palladium (Pd), the material having a standard electrode potential higher than the standard electrode potentials of the metal comprised in the second variable resistance layer 103 and the material comprised in the first electrode layer 101.

The first electrode layer 101, which is connected to the first variable resistance layer 102 having a higher degree of oxygen deficiency, may comprise a material such as tungsten (W), nickel (Ni), tantalum (Ta), titanium (Ti), aluminum (Al), tantalum nitride (TaN), titanium nitride (TiN), the material having a standard electrode potential lower than the standard electrode potential of the metal comprised in the first variable resistance layer 102. As described above, a higher value of standard electrode potential indicates higher oxidation resistant characteristics.

That is to say, standard electrode potential $V_2$ of the second electrode layer 104, standard electrode potential $V_{r2}$ of the metal comprised in the second resistance variable layer 103, standard electrode potential $V_{r1}$ of the metal comprised in the first resistance variable layer 102, and standard electrode potential V1 of the first electrode layer 101 may satisfy a relationship: $V_{r2}<V_2$ and $V_1<V_2$. In addition, a relationship of $V_2>V_{r2}$, $V_{r1} \leq V_1$ may be satisfied.

By adopting the above configuration, an oxidation reduction reaction selectively occurs in the second variable resistance layer 103 in the vicinity of the interface between the second electrode layer 104 and the second variable resistance layer 103, and thus stable resistance change phenomenon is obtained.

[Support Layer in Contact with Second Variable Resistance Layer]

In the variable resistance nonvolatile memory elements 10 and 11, for the purpose of supporting the periphery of the second variable resistance layer 103, the support layer in contact with the second variable resistance layer 103 may be formed so as to cover the periphery of the second variable resistance layer 103.

The material used for the support layer is preferably a material which has a band gap greater than the band gap of the material comprised in the second variable resistance layer 103, the support layer being in contact with the second variable resistance layer 103 which is selectively side-etched.

Figure 14:
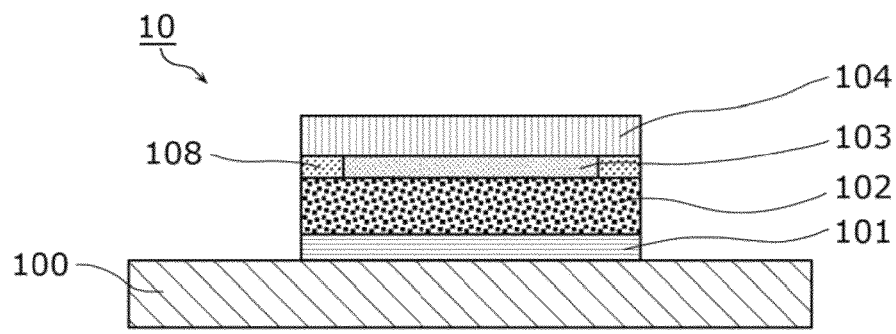
[FIG. 14]

FIG. 14 is a diagram illustrating a structural example of the variable resistance nonvolatile memory element 10 in which a support layer 108 is disposed on the periphery of the second variable resistance layer 103, the support layer 108 having a band gap greater than the band gap of the second variable resistance layer 103.

In general, a material having a greater band gap has a higher breakdown voltage. Thus, when a conductive path is formed by forming, a material having a greater band gap is selected for the support layer 108, so that breakdown of the second variable resistance layer 103 is selectively caused, and a conductive path is formed only in the second variable resistance layer 103. The support layer 108 composed of a material having a greater band gap does not contribute to the resistance change operation of the variable resistance nonvolatile memory elements 10 and 11.

Such a material having a greater band gap includes, for example, silicon oxide ($SiO_2$). The manufacturing method for the support layer 108 includes a method of forming a silicon oxide, for example, by CVD method after the variable resistance nonvolatile memory elements 10 and 11 are manufactured according to the manufacturing method illustrated in FIG. 8 or 14.

A support layer having electrical insulation and a thickness thicker than the film thickness of the second resistance variable layer 103 may be formed as the support layer which is in contact with the second resistance variable layer 103.

Figure 15:
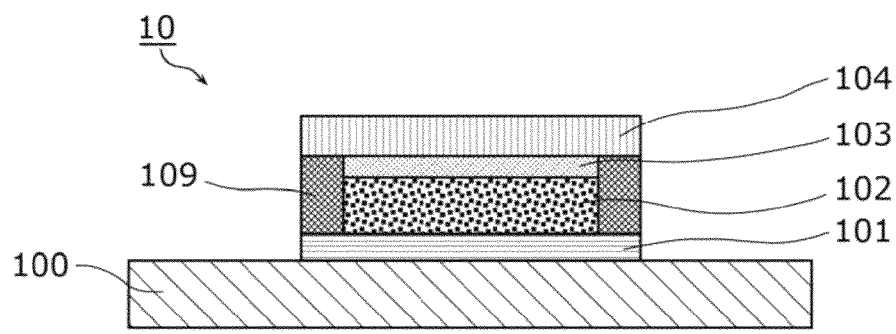
[FIG. 15]

FIG. 15 is a diagram illustrating a structural example of the variable resistance nonvolatile memory element 10 in which a support layer 109 is disposed on the periphery of the second variable resistance layer 103, the support layer 109 having electrical insulation and a thickness thicker than the second variable resistance layer 103.

The thickness of the support layer 109 in the direction perpendicular to the major surface of the substrate 100 is thicker than the thickness (film thickness) of the second resistance variable layer 103 in the direction perpendicular to the major surface of the substrate 100. Because the support layer 109 has electrical insulation, breakdown of the second resistance variable layer 103 is selectively caused at the time of forming, and thus a conductive path is formed.

When the first resistance variable layer 102 is oxygen-deficient metal oxide, a support layer can be easily formed on the periphery of the second variable resistance layer 103 by oxidizing the oxygen-deficient metal oxide. That is to say, the first resistance variable layer 102 comprising oxygen-deficient metal oxide is oxidized to be expanded, thus the support layer 109 can be disposed on the periphery of the second variable resistance layer 103.

For example, when the first variable resistance layer 102 comprises an oxygen-deficient tantalum oxide layer, oxidation treatment is performed on the oxygen-deficient tantalum oxide layer, and thus the support layer 109 comprising insulating tantalum oxide can be formed. The oxygen-deficient tantalum oxide is oxidation-treated, and expanded in volume to become the support layer 109 which is in contact with the second variable resistance layer 103.

The support layer 109 does not necessarily need to cover the entire periphery of the second variable resistance layer 103. That is to say, the support layer 109 may be disposed so as to cover part of the periphery of the second variable resistance layer 103.

For example, when the support layer 109 is formed by oxidizing and expanding the resistance variable layer 102 as described above, the support layer 109 may not necessarily cover the entire periphery of the second resistance variable layer 103 in some cases.

Figure 16:
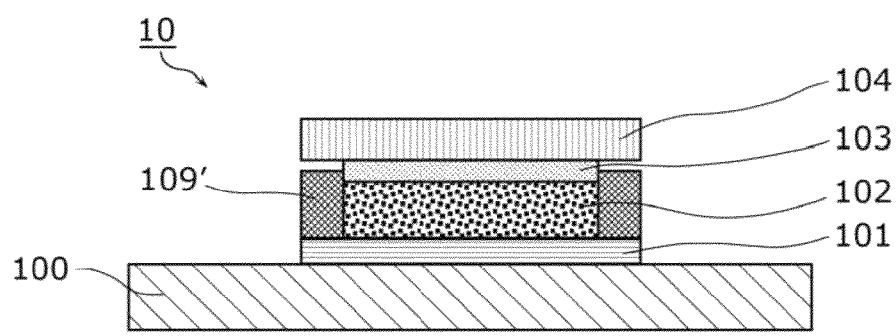
[FIG. 16]

FIG. 16 is a diagram illustrating an example of the variable resistance nonvolatile memory element 10 in the some cases.

Even when the support layer 109' is disposed so as to cover part of the periphery of the second variable resistance layer 103 as in FIG. 16, the effect is obtained that the support layer 109' sufficiently supports the second variable resistance layer 103. In addition, the support layer 109' has no adverse effect on the forming and resistance change operation.

The periphery of the second variable resistance layer 103 may be covered by depletion. Because depletion does not contribute to an electrical operation at all, breakdown of the second variable resistance layer 103 is selectively caused, and a conductive path is formed.

In the above, a variable resistance nonvolatile memory element and a method of manufacturing the variable resistance nonvolatile memory element according to the embodiment have been described based on the embodiment.

According to a variable resistance nonvolatile memory element and a method of manufacturing the variable resistance nonvolatile memory element according to the embodiment, the element area of only one resistance variable layer having a high resistance and a thin film thickness between the resistance variable layers is reduced, and thus the forming current can be reduced without increasing the possibility of collapse of the element while maintaining the design rule for the semiconductor process. Consequently, a stable operation of the variable resistance nonvolatile memory element due to reduced forming current is achieved.

The present invention is not limited to the above embodiment. Within a scope not departing from the spirit of the present invention, an embodiments to which various changes that occur to those skilled in the art are made, and an embodiment formed by combining components in different embodiments may also be included in the range of one or multiple embodiments.

INDUSTRIAL APPLICABILITY

The variable resistance nonvolatile memory element according as to the present invention is useful as a nonvolatile memory device such as a ReRAM.

REFERENCE SIGNS LIST 10, 11, 20 Variable resistance nonvolatile memory element
100, 200 Substrate
101, 201 First electrode layer
102, 202 First variable resistance layer
103, 203 Second variable resistance layer
104, 204 Second electrode layer
101' First electrode material layer
102' First variable resistance material layer
103' Second variable resistance material layer
104' Second electrode material layer
101a, 102a, 103a, 104a, 102b, 103b Outline
105, 205 Variable resistance layer
105' Variable resistance material layer
106 Conductive path
107 Etched side portion
108, 109, 109' Support layer

The invention claimed is:

1. A variable resistance nonvolatile memory element comprising:
a first electrode layer;
a second electrode layer;
a first variable resistance layer formed between the first electrode layer and the second electrode layer; and
a second variable resistance layer interposed between the first variable resistance layer and one of the first electrode layer and the second electrode layer, the second variable resistance layer having a resistance value higher than a resistance value of the first variable resistance layer,
wherein the second variable resistance layer has a conductive path formed therein, and
wherein when the second variable resistance layer is viewed in a direction perpendicular to a major surface of the second variable resistance layer:
an outline of the second variable resistance layer is located inwardly of an outline of any of the first variable resistance layer and the one of the first layer and the second electrode layer; and
an outline of a face of the second variable resistance layer is located inwardly of an outline of a face of the first variable resistance layer, the face of the second variable resistance layer being in contact with the first variable resistance layer, the face of the first variable resistance layer being in contact with the second variable resistance layer,
wherein the variable resistance nonvolatile memory element further comprises a support layer disposed to cover a periphery of the second variable resistance layer, and
wherein the support layer comprises a material having a band gap greater than a band gap of a material composed in the second variable resistance layer.

2. The variable resistance nonvolatile memory element according to claim 1,
wherein a thickness of the second variable resistance layer in the direction is thinner than a thickness of the first variable resistance layer in the direction.

3. The variable resistance nonvolatile memory element according to claim 1,
wherein the first variable resistance layer has electrical conductivity.

4. The variable resistance nonvolatile memory element according to claim 1,
wherein the support layer comprises an insulating material, and
a thickness of the support layer in the direction is thicker than a thickness of the second variable resistance layer in the direction.

5. The variable resistance nonvolatile memory element according to claim 1,
wherein the first variable resistance layer comprises a metal oxide containing the same metal as a metal contained in a metal oxide comprised in the second variable resistance layer, and
the metal oxide comprised in the first variable resistance layer has a degree of oxygen deficiency greater than a degree of oxygen deficiency of the metal oxide comprised in the second variable resistance layer.

6. A variable resistance nonvolatile memory element comprising:
a first electrode layer;
a second electrode layer;
a first variable resistance layer formed between the first electrode layer and the second electrode layer; and
a second variable resistance layer interposed between the first variable resistance layer and one of the first electrode layer and the second electrode layer, the second variable resistance layer having a resistance value higher than a resistance value of the first variable resistance layer,
wherein when the second variable resistance layer is viewed in a direction perpendicular to a major surface of the second variable resistance layer:
an outline of the second variable resistance layer is located inwardly of an outline of any of the first variable resistance layer and the one of the first layer and the second electrode layer; and
an outline of a face of the second variable resistance layer is located inwardly of an outline of a face of the first variable resistance layer, the face of the second variable resistance layer being in contact with the first variable resistance layer, the face of the first variable resistance layer being in contact with the second variable resistance layer, wherein the first variable resistance layer comprises a metal oxide containing a different metal from a metal contained in a metal oxide comprised in the second variable resistance layer, and
the metal contained in the metal oxide comprised in the first variable resistance layer has a standard electrode potential higher than a standard electrode potential of the metal contained in the metal oxide comprised in the second variable resistance layer.

7. A method of manufacturing a variable resistance nonvolatile memory element, the method comprising:
- forming a first electrode material layer on a substrate;
- forming a first variable resistance material layer on the first electrode material layer;
- forming a second variable resistance material layer above the first electrode material layer, the second variable resistance material layer having a resistance value higher than a resistance value of the first variable resistance material layer;
- forming a second electrode material layer on the first variable resistance material layer and the second variable resistance material layer;
- forming a first electrode layer by processing the first electrode material layer;
- forming a second electrode layer by processing the second electrode material layer;
- forming a first variable resistance layer by processing the first variable resistance material layer; and
- forming a second variable resistance layer by processing the second variable resistance material layer,
- wherein in the forming of the first electrode layer, the forming of the second electrode layer, the forming of the first variable resistance layer, and the forming of the second variable resistance layer, when the second variable resistance layer is viewed in a direction perpendicular to a major surface of the substrate:
  - an outline of the second variable resistance layer is displaced inwardly from an outline of any one of the second electrode layer and the first variable resistance layer; and
  - an outline of a face of the second variable resistance layer is displaced inwardly from an outline of a face of the first variable resistance layer, the face of the second variable resistance layer being in contact with the first variable resistance layer, the face of the first variable resistance layer being in contact with the second variable resistance layer.

8. The method of manufacturing a variable resistance nonvolatile memory element according to claim 7,
- wherein the forming of the first electrode layer, the forming of the second electrode layer, the forming of the first variable resistance layer, and the forming of the second variable resistance layer are performed in a single etching process at the same time.

9. The method of manufacturing a variable resistance nonvolatile memory element according to claim 7,
- wherein the forming of the first electrode layer, the forming of the second electrode layer, and the forming of the first variable resistance layer are performed in a single etching process at the same time, and
- in the forming of the second variable resistance layer subsequent to the single etching process, the second variable resistance material layer is further selectively etched, and the second variable resistance layer is formed.

* * * * *